United States Patent [19]

Wei

[11] 4,350,564

[45] Sep. 21, 1982

[54] METHOD OF ETCHING METALLIC MATERIALS INCLUDING A MAJOR PERCENTAGE OF CHROMIUM

[75] Inventor: Ching-Yeu Wei, Schenectady, N.Y.

[73] Assignee: General Electric Company, Schenectady, N.Y.

[21] Appl. No.: 200,771

[22] Filed: Oct. 27, 1980

[51] Int. Cl.³ .............................................. B44C 1/22
[52] U.S. Cl. .................................. 156/659.1; 156/656
[58] Field of Search ...................... 156/656, 659.1, 635

[56] References Cited

U.S. PATENT DOCUMENTS

| 3,539,408 | 11/1970 | Cashau et al. | 156/659.1 X |
| 3,616,349 | 10/1971 | Szupillo | 204/143 |
| 3,695,955 | 10/1972 | Jochems et al. | 156/659.1 |
| 4,057,831 | 11/1977 | Jacobs et al. | 156/659.1 X |
| 4,105,468 | 8/1978 | Geshner | 156/656 X |
| 4,160,691 | 7/1979 | Abolafia et al. | 156/659.1 X |

Primary Examiner—Lorraine T. Kendell
Attorney, Agent, or Firm—Julius J. Zaskalicky; James C. Davis, Jr.; Marvin Snyder

[57] ABSTRACT

A method of etching a desired pattern in a thin film of chromium deposited on a substrate is described. A layer of a masking material which is etch-resistant is formed on the film of chromium and provided with the desired pattern. Portions of the thin film of chromium uncovered by the patterned layer of etch-resistant material are covered with a thin layer of aluminum having a multiplicity of holes. The substrate including the layer of aluminum in contact with thin film of chromium is immersed in a dilute hydrochloric acid solution whereby the layer of aluminum and the portion of the thin film of chromium in contact therewith are dissolved thereby providing the desired pattern in the thin film of chromium.

16 Claims, 13 Drawing Figures

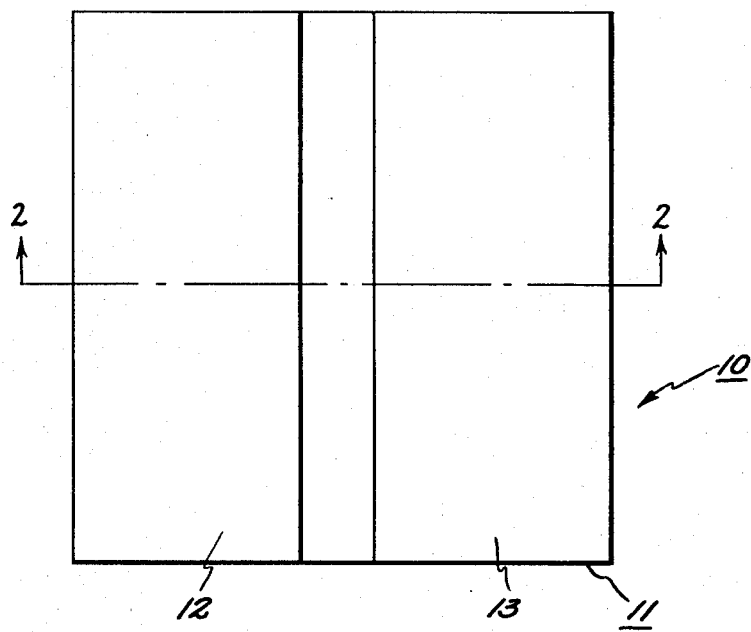
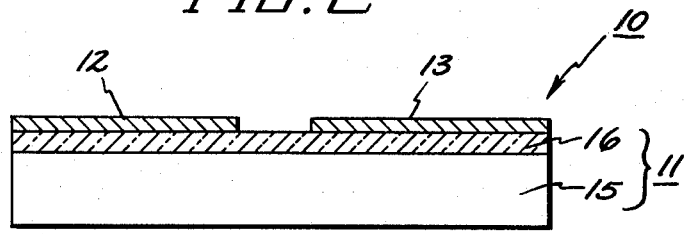

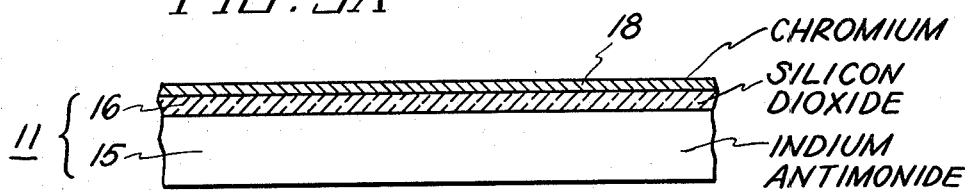
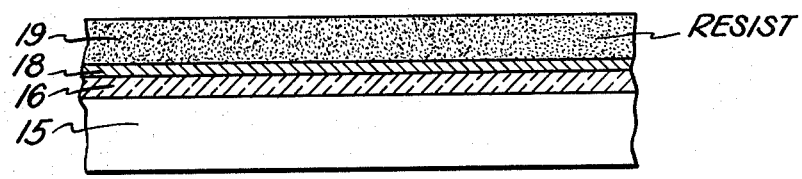
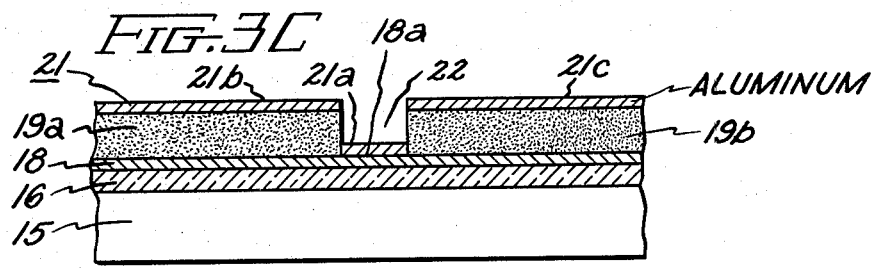
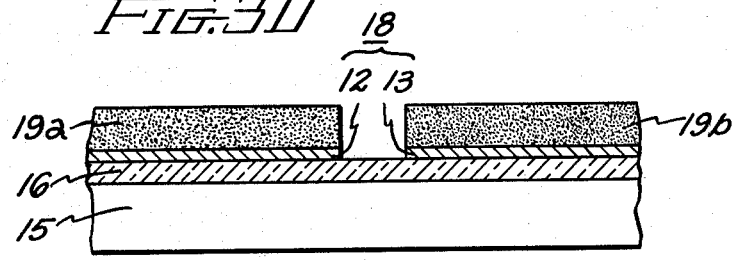
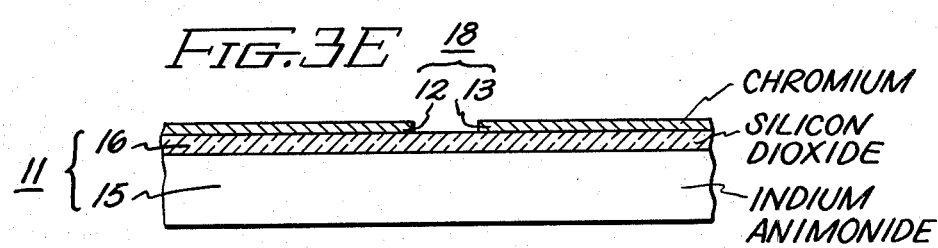

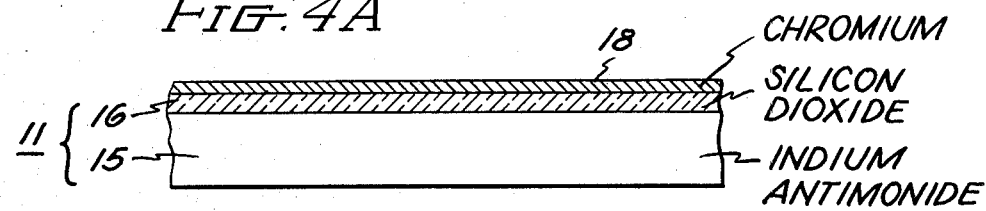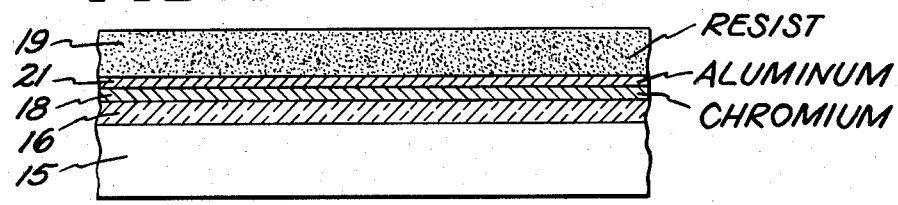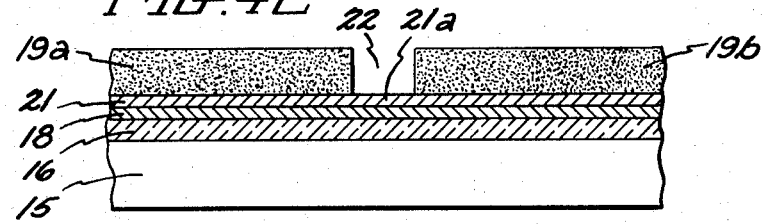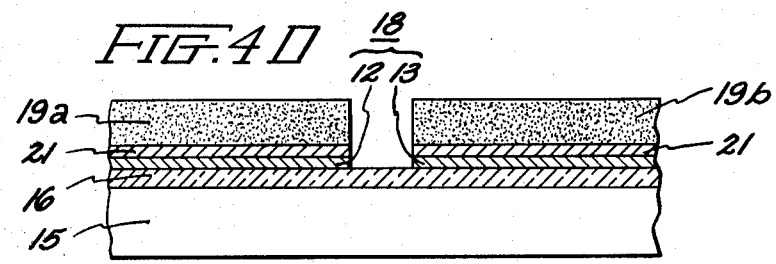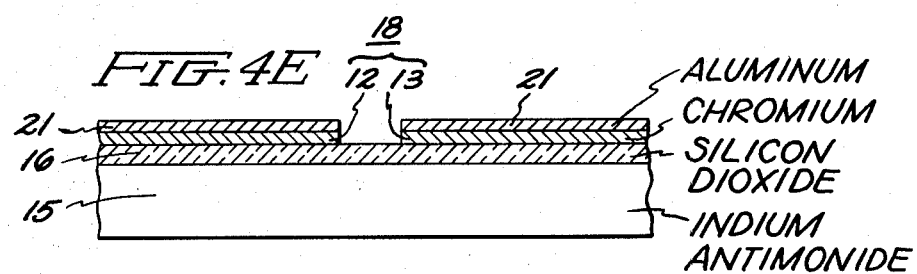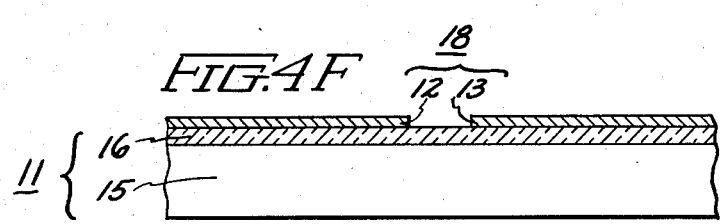

METHOD OF ETCHING METALLIC MATERIALS INCLUDING A MAJOR PERCENTAGE OF CHROMIUM

The present invention relates to a method of etching materials which include chromium as a major constituent and more particularly relates to a method of selectively etching a thin film of chromium formed on the surface of a substrate.

Chromium, particularly when exposed to air, acquires an oxide surface coating or passivating covering which makes chromium difficult to etch in most acids. Once the surface of the chromium is penetrated or depassivated, it can be readily etched in most mineral acids. Concentrated hydrochloric acid will depassivate the surface of chromium and when the chromium is depassivated, it is dissolved very rapidly. The depassivation of the chromium can be accelerated by raising the temperature of the acid etchant, or it can be triggered by physical contact with an element more electropositive than chromium, such as aluminum. The use of high etchant tempertures for depassivation is not reliable for the etching of thin films to close tolerances because the depassivation appears to be extremely sensitive to the exact chemistry of the surface coating. High etchant temperatures are also undesirable as uncontrollable undercutting of a deposited film of chromium will occur as a result of the high etch rate and consequently will limit the smallest geometry which can be patterned in the chromium film. When an aluminum wire is brought into contact with such a film of chromium in hydrochloric acid, depassivation is initiated at the spot of contact and spreads rapidly over the area of the film; however, the depassivation reaction does not always spread over the entire area. Although etchants for etching chromium films containing iron potassium cyanide $(Fe_3(KCN)_6)$ and sodium hydroxide (NaOH) do not require surface depassivation, they generally weaken the adhesion of the resist layer utilized for patterning the chromium film and yield poorly defined line edges in the film.

The present invention is directed to overcoming limitations such as pointed out above in the etching of thin films of metals containing chromium as a major constituent.

It is a primary object of the present invention to provide a simple, reliable and economical method for etching with high resolution thin films of metals including chromium as a major constituent.

In carrying out the invention in one illustrative embodiment thereof, there is provided a substrate comprising an insulating material such as silicon dioxide on which a thin film of chromium has been formed. A layer of a material which is resistant to the etching action of an acid is deposited over the exposed surface of the film of chromium. A pattern which it is desired to etch in the thin film of chromium is formed in the layer of etch-resistant material thereby exposing portions of the thin film of chromium uncovered by the patterned layer of etch-resistant material. A thin layer of aluminum is deposited on the portions of the film of chromium exposed by the pattern formed in the layer of etch-resistant material. The portion of the layer of aluminum contained in the patterned portion of the etch-resistant material and the portions of the film of chromium lying thereunder are etched in an acidic etchant to provide the desired pattern in the film of chromium.

The novel features which are believed to be characteristic of the present invention are set forth with particularity in the appended claims. The invention itself, together with further objects and advantages thereof may best be understood by reference to the following description taken in connection with the accompanying drawings wherein:

FIG. 1 is a plan view of a composite body including a thin film of chromium processed in accordance with the present invention to form a desired pattern in the thin film of chromium.

FIG. 2 is a sectional view of FIG. 1 taken along sectional lines 2—2 of FIG. 1.

FIGS. 3A–3E shows cross sections of structures representing successive steps in carrying out the method of the invention in accordance with one embodiment thereof.

FIGS. 4A–4E show cross sections of structures representing successive steps in carrying out the method of the invention in accordance with another embodiment thereof.

Referring now to FIGS. 1 and 2, there is shown a composite body 10 including a substrate 11 on which has been formed in accordance with the present invention a pair of thin film chromium electrodes 12 and 13. The electrodes are shown with adjacent straight edges closely spaced. The substrate 11 may constitute an elemental semiconductor material such as silicon, or germanium, or a compound semiconductor material, such as gallium arsenide, gallium phosphide or indium antimonide. The substrate may also comprise a plurality of layers of materials. As shown, the substrate comprises a layer 15 of indium antimonide on which is formed a layer 16 silicon dioxide. The silicon dioxide layer 16 may represent either gate or field oxide of an integrated circuit such as an imaging array for sensing radiation. Chromium in thin layers, for example, about one hundred Angstroms thick, provides excellent transmission of infrared radiation at certain bands of wavelengths, has relatively low sheet resistance in this thickness, and accordingly is suitable for electrodes in infrared imaging devices. Thicker films or layers of chromium suitable patterned are also useful as masks for ion milling various layers of various materials in the fabrication of integrated circuit devices of small geometries.

A method of fabricating the composite structure 10 of FIGS. 1 and 2 in accordance with the present invention will now be described in connection with FIGS. 3A–3E. Elements of FIGS. 3A–3E which are identical to elements of FIGS. 1 and 2 are identically designated. A thick layer 15 of indium antimonide semiconductor material is provided. A layer 16 of silicon dioxide about 1000 Angstroms thick is formed on layer 15 at low temperatures by techniques well known in the art. A thin film 18 of chromium about 75 Angstroms thick is deposited on the exposed surface of the silicon dioxide layer 16 by sputtering in a low pressure argon atmosphere to provide the composite structure shown in FIG. 3A. A layer 19 of a material which is resistant to the etching action of hydrochloric acid is deposited over the exposed surface of the thin film 18 of chromium as shown in FIG. 3B. A suitable etch-resistant layer would be azide photoresist AZ1350J available from the Shipley Company of Newton, Mass. After exposing and developing of the layer of photoresist to provide a pair of retained portions 19a and 19b thereof, a thin layer 21 of aluminum about 150 Angstroms thick is sputtered on the exposed surfaces of the resultant assembly including the portion 18a of the surface of the thin film of chromium 18 exposed by the aperture or pattern 22 formed in the layer 19 of photoresist and also on the exposed surfaces of the retained portions 19a and 19b of the photoresist as shown in FIG. 3C. The thin layer 21 of aluminum includes portions 21a, 21b, and 21c deposited on respective parts 18a, 19a, and 19b. The resultant structure is then immersed in a dilute solution of hydrochloric acid consisting of one part of concentrated hydrochloric acid to one part of glycerine by volume for about 30 seconds until the portion 21a of the aluminum deposited on the surface 18a of thin film of chromium and the portion of the chromium film lying thereunder are completely removed, as shown in FIG. 3D. Next, the retained portions 19a and 19b of the layer of photoresist are removed by means of a suitable photoresist stripper to provide the resultant structure shown in FIG. 3E.

A feature of the present invention is the provision of a layer of aluminum which is sufficiently thin as to be discontinuous, that is, a layer of deposited aluminum less than about 400 Angstroms thick which has a multiplicity of voids or holes distributed throughout the layer in direct contact with the portion of the thin film of chromium to be etched or removed. The aluminum is electropositive with respect to chromium. Accordingly, a multiplicity of electrolytic cells are formed when the structure of the layer of aluminum in direct contact with the film of chromium is immersed in the dilute hydrochloric acid solution. The multiplicity of electrolytic cells are formed over the area of contact of the layer of aluminum with the thin film of chromium. Electrolytic action causes hydrogen to be released at the chromium interface which reduces or depassivates the surface oxide layer on the film of chromium and causes the etching or removal thereof. As the multiplicity of electrolytic cells are distributed substantially uniformly over the area of contact of the layer of aluminum and the film of chromium, etching action occurs substantially uniformly. The use of a dilute solution of hydrochloric acid enables the etching to proceed at a moderate rate and to be stopped by visual means when the desired etch pattern has been obtained in the film of chromium. The retained portions of the etch mask overlying the edges of the etch pattern function as etch stops. If desired, layers of aluminum substantially thicker than about 400 Angstroms could be utilized, provided they are provided with a multiplicity of holes or voids, for example by paterning, substantially uniformly distributed over the area of contact of the layer of aluminum and the thin film of chromium.

Another method of fabricating the composite structure 10 of FIGS. 1 and 2 in accordance with the present invention will now be described in connection with FIGS. 4A-4E. Elements of FIGS. 4A-4E which are identical to elements of FIGS. 1 and 2 are identically designated. A thick layer 15 of indium antimonide semiconductor material is provided. A layer 16 of silicon dioxide about 1000 Angstroms thick is formed on the layer 15 at low temperatures by techniques well known in the art. A thin film 18 of chromium about 75 Angstroms thick is deposited on the exposed surface of the silicon dioxide layer 16 by sputtering in a low pressure argon atmosphere to provide the composite structure shown in FIG. 4A. A thin layer 21 of aluminum about 150 Angstroms thick is deposited on the exposed surfaces of the thin film 18 of chromium. A layer 19 of a material which is resistant to the etching action hydrochloric acid is deposited over the exposed surface of the thin layer 21 of aluminum, as shown in FIG. 4B. A suitable etch-resistant layer would be azide photoresist AZ1350J available from the Shipley Company of Newton, Mass. After exposing and developing of the layer of photoresist to provide a pair of retained portions 19a and 19b thereof, the assembly including the surface of the thin layer 21 of aluminum exposed by the aperture of pattern 22 formed in the layer 19 of photoresist, as shown in FIG. 4C, is immersed in a dilute solution of hydrochloric acid consisting of one part of concentrated hydrochloric acid to one part of glycerine by volume for about 30 seconds until the portion 21a of the layer of aluminum on the thin film of chromium and the portion of the chromium film lying thereunder are completely removed, as shown in FIG. 4D. Next, the retained portions 19a and 19b of the layer of photoresist are removed by means of a suitable photoresist stripper, as shown in FIG. 4E, and the remaining portions of the layer of aluminum are removed by a suitable aluminum etch thereby obtaining the structure shown in FIG. 4F.

While the invention has been described in the examples in connection with the etching of a thin film constituted of chromium, such films could be constituted of a major percentage of chromium and a minor percentage of a material such as or nickel. A metal constituted of 95% chromium by weight and 5% nickel by weight has higher conductivity than pure chromium.

While in connection with the method described above, a dilute solution of hydrochloric acid was utilized, it will be understood that other mineral etching acids could be utilized in the process particularly hydrobromic and hydroiodic acid of the halogen family of acids. The extent of dilution of the acid etchant would depend upon the rate of etching desired. While in the examples the hydrochloric acid etchant was diluted with glycerine, other dilutants may be utilized, for example water. Glycerine is a particularly useful dilutant as its viscosity makes the removal of the thin film of metal at the site of dissolution sluggish and causes the etching action to be anisotropic, that is to proceed more rapidly in the direction toward the substrate rather than in the direction orthogonal to this direction. Of course, any acid utilized should be compatible with the materials utilized in the substrate as well as in the etch-resistant mask.

While a thin layer of aluminum 150 Angstroms thick was utilized in the examples described above, other thicknesses of deposited aluminum may be utilized provided they are less than about 400 Angstroms. When aluminum is deposited on a surface such as the surface of the thin film of metal to a thickness substantially less than 400 Angstroms, it has a multiplicity of holes or voids extending from one major surface to the other major surface thereof. As the thickness of the film is increased, the holes and voids are reduced until at a thickness of about 400 Angstroms the film becomes substantially continuous and so remains for greater thicknesses. The efficacy of the method of the present invention depends on the existence of these holes or voids in the layer of the aluminum to provide a multiplicity of electrolytic cells which provide local etching and removal of the film of chromium. For thicknesses greater than about 400 Angstroms, aluminum provided with a suitable distribution of holes would produce similar etching action. Thicker layers of aluminum may have some pinholes located therein and etching action attempted with such thicker layers without providing the distribution of holes described produces unsatisfactory results as etching of the thin film of chromium takes place through any pinholes in the layer and rapidly undercuts the underlying layer of chromium.

While in the examples of the invention described above, a film of chromium about 75 Angstroms thick is utilized, films of lesser and even substantially greater thicknesses may be etched by the method of the present invention.

While in the examples of the invention described above, the film of chromium and the layer of aluminum are provided by sputtering, other means could be utilized, for example, evaporation.

While the layer of etch-resistant material utilized in the examples described above is constituted of photoresist material, this layer could as well be contituted of other materials, for example, silicon dioxide.

While in the method of the present invention described above the substrate with the thin film of chromium and the layer of aluminum thereon is immersed in an acid etchant, it will be understood that action could as well be accomplished by bringing the etchant into contact with the structure to be etched by other means such as by flowing the etchant thereover.

While in the examples of the invention described above a thin layer of aluminum is deposited over the film of chromium to provide electrolytic action when the assembly is exposed to an acidic etchant, other metals electropositive with respect to chromium could be used, for example, zinc, provided they are compatible with other materials used in the process.

While the invention has been described in specific embodiments, it will be understood that modifications, such as those described above, may be made by those skilled in the art and it is intended by the appended claims to cover all such modifications and changes as fall within the true spirit and scope of the invention.

What is claimed is:

1. A method of etching a first pattern in a film of a metal including a major percentage of chromium formed on the surface of a substrate comprising:
   depositing a layer of a material which is resistant to the etching action of an acidic etchant over the exposed surface of said film of metal,
   forming in said layer of etch-resistant material a second pattern which is substantially identical to said first pattern to expose portions of said film of metal constituting said first pattern,
   depositing a thin layer of a metal electropositive with respect to chromium on the portions of said film of metal exposed by said second pattern, said layer being provided with a multiplicity of holes extending between major surfaces thereof,
   etching the portions of said layer of metal deposited in the portions of said layer of etch-resistant material exposed by said second pattern and the portions of said film of metal lying thereunder with said acidic etchant to remove the portions of said film of metal contained within said first pattern and the portions of said layer of metal lying thereover.

2. The method of claim 1 in which said layer of metal electropositive with respect to chromium is aluminum.

3. The method of claim 2 in which etching of said film of metal and said layer of aluminum is accomplished by immersion of said substrate with said film and said layers thereon in said acidic etchant.

4. The method of claim 1 in which said film of metal has a coating of chromium oxide on the surface thereof.

5. The method of claim 1 in which said film of metal is substantially all chromium.

6. The method of claim 1 in which said film of metal includes a minor percentage of nickel.

7. The method of claim 1 in which said acidic etchant is a dilute solution of hydrochloric acid.

8. The method of claim 7 in which the dilutant of said dilute solution of hydrochloric acid is glycerine.

9. The method of claim 2 in which said layer of aluminum has a thickness less than a value at which voids inherently included in deposited layers of aluminum are substantially nonexistent.

10. The method of claim 2 in which said layer of aluminum is less than about 400 Angstroms thick.

11. The method of claim 1 in which said substrate includes a layer of silicon dioxide on which said film of metal is formed.

12. The method of claim 1 in which said layer of etchresistant material having said second pattern is removed after etching said first pattern in said film of metal.

13. A method of etching a first pattern in a film of a metal including a major percentage of chromium formed on the surface of a substrate comprising:
    depositing a layer of a metal electropositive with respect to chromium on the exposed surface of said film of metal, said layer being provided with a multiplicity of holes extending between major surfaces thereof,
    depositing a layer of material which is resistant to the etching action of an acidic etchant over the exposed surface of said layer of metal,
    forming in said layer of etch-resistant material a second pattern which is substantially identical to said first pattern to expose portions of said layer of metal uncovered thereby,
    etching the portions of said layer of metal exposed by said second pattern and the portions of said film of metal lying thereunder with said acidic etchant to remove the portions of said film of metal contained within said first pattern and the portions of said layer of metal lying thereover,
    removing said layer of etch-resistant material,
    removing the remaining portions of said layer of metal.

14. The method of claim 13 in which said layer of metal electropositive with respect to chromium is aluminum.

15. The method of claim 14 in which said layer of aluminum has a thickness less than a value at which voids inherently included in deposited layers of aluminum are substantially nonexistent.

16. The method of claim 14 in which said layer of aluminum is less than about 400 Angstroms thick.

* * * * *